United States Patent [19]
Okamoto

[11] Patent Number: 5,965,948
[45] Date of Patent: Oct. 12, 1999

[54] SEMICONDUCTOR DEVICE HAVING DOUBLED PADS

[75] Inventor: Kohei Okamoto, Tokyo, Japan

[73] Assignee: NEC Corporation, Tokyo, Japan

[21] Appl. No.: 08/607,233

[22] Filed: Feb. 26, 1996

[30] Foreign Application Priority Data

Feb. 28, 1995 [JP] Japan .................................. 7-067049

[51] Int. Cl.⁶ .......................... H01L 23/48; H01L 23/52; H01L 29/40
[52] U.S. Cl. .......................... 257/786; 257/773; 257/737
[58] Field of Search .................................. 257/786, 781, 257/784, 48, 737, 738, 780, 773, 734; 438/613

[56] References Cited

U.S. PATENT DOCUMENTS

| 5,194,931 | 3/1993 | Araki | 257/786 |
| 5,442,241 | 8/1995 | Tane | 257/784 |
| 5,587,607 | 12/1996 | Yasuda et al. | 257/784 |

FOREIGN PATENT DOCUMENTS

| 59-21035 | 2/1984 | Japan | 257/784 |
| 59-22335 | 2/1984 | Japan | 257/786 |
| 60-98652 | 6/1985 | Japan | 257/786 |
| 60-130153 | 11/1985 | Japan | 257/786 |
| 63-244853 | 10/1988 | Japan | 257/786 |
| 2-215143 | 8/1990 | Japan . | |
| 3-58426 | 3/1991 | Japan . | |
| 3-198358 | 8/1991 | Japan . | |
| 7-67049 | 2/1995 | Japan . | |
| 60-113636 | 8/1995 | Japan . | |

*Primary Examiner*—Mahshid Saadat
*Assistant Examiner*—Jhihan B Clark
*Attorney, Agent, or Firm*—Laff, Whitesel, Conte & Saret, Ltd.

[57] ABSTRACT

In a semiconductor device, a plurality of first pads are arranged in a row on a semiconductor chip, and a plurality of second pads are arranged in another row on the semiconductor chip. One of the first pads and one of the second pads is capable of receiving the same signal.

12 Claims, 9 Drawing Sheets

SEMICONDUCTOR DEVICE HAVING DOUBLED PADS

BACKGROUND OF THE INVENTION

1. Field of the Invention

The present invention relates to a semiconductor device, and more particularly, the improvement of pad arrangements of the semiconductor device.

2. Description of the Related Art

Generally, pad arrangements depend on types of semiconductor packages. For example, in a tape carrier package (TCP) specific semiconductor chip, pads are needed to he located in a linear arrangement in consideration of the mounting restriction on a tape. For example, the spacing between the pads is relatively small, for example, about 70 μm. Also, in a chip-on-glass (COG) specific chip, pads are not needed to be located in a linear arrangement, and are actually located in a staggered (zigzagged) arrangement. For example, the spacing between the pads is relatively large, for example, about 150 μm. This will be explained later in detail.

A semiconductor chip may be designed for both TCP and COG packages. In this case, however, since pads of a linear arrangement whose spacing is relatively large are adopted, the chip is deteriorated in terms of integration. This will also be explained later in detail.

Note that, in the prior art, it is known that a plurality of first pads and a plurality of second pads are arranged linearly in a row, and one of the first pads and one of the second pads are capable of receiving the same signal (see: JP-A-60-98652). Also in this case, however, the size of the chip is increased, and accordingly, the chip is deteriorated in terms of integration.

SUMMARY OF THE INVENTION

It is an object of the present invention to enhance the integration of a semiconductor device used commonly for different packages.

According to the present invention, in a semiconductor device, a plurality of first pads are arranged in a row on a semiconductor chip, and a plurality of second pads are arranged in another row on the semiconductor chip. One of the first pads and one of the second pads are capable of receiving the same signal. This can shorten the spacing of the pads.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1, 2 and 3.

Figure 1:
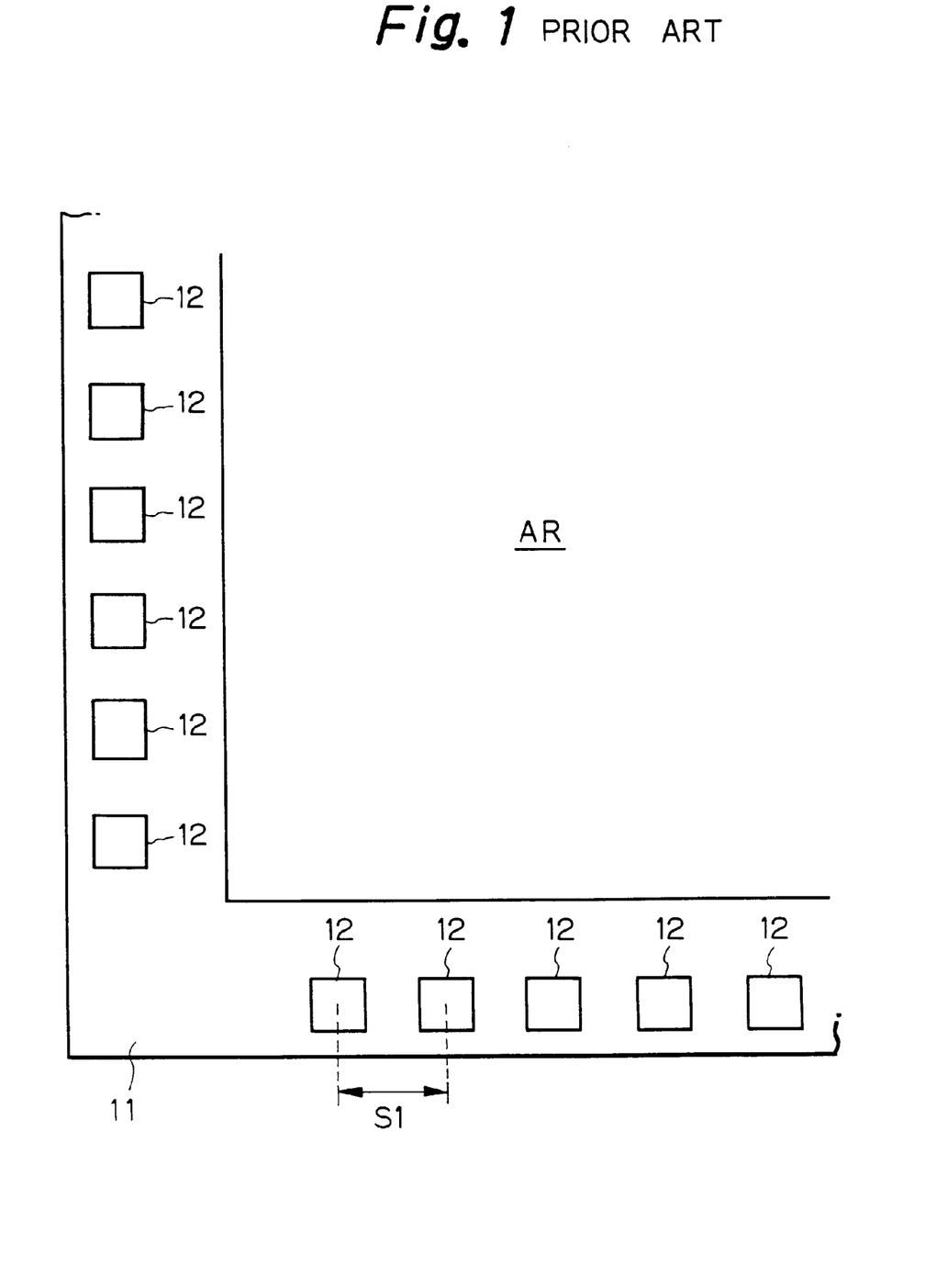
FIG. 1 is a plan view illustrating a TCP specific chip.

In FIG. 1, which illustrates a prior art TCP specific chip, a semiconductor chip 11 includes a plurality of pads 12 located in a linear arrangement along the periphery of an active area AR of the semiconductor chip 11, since the semiconductor chip 11 is mounted on a tape. In this case, a spacing S1 between the pads 12 is about 70 μm in consideration of the mounting restriction.

Figure 2:
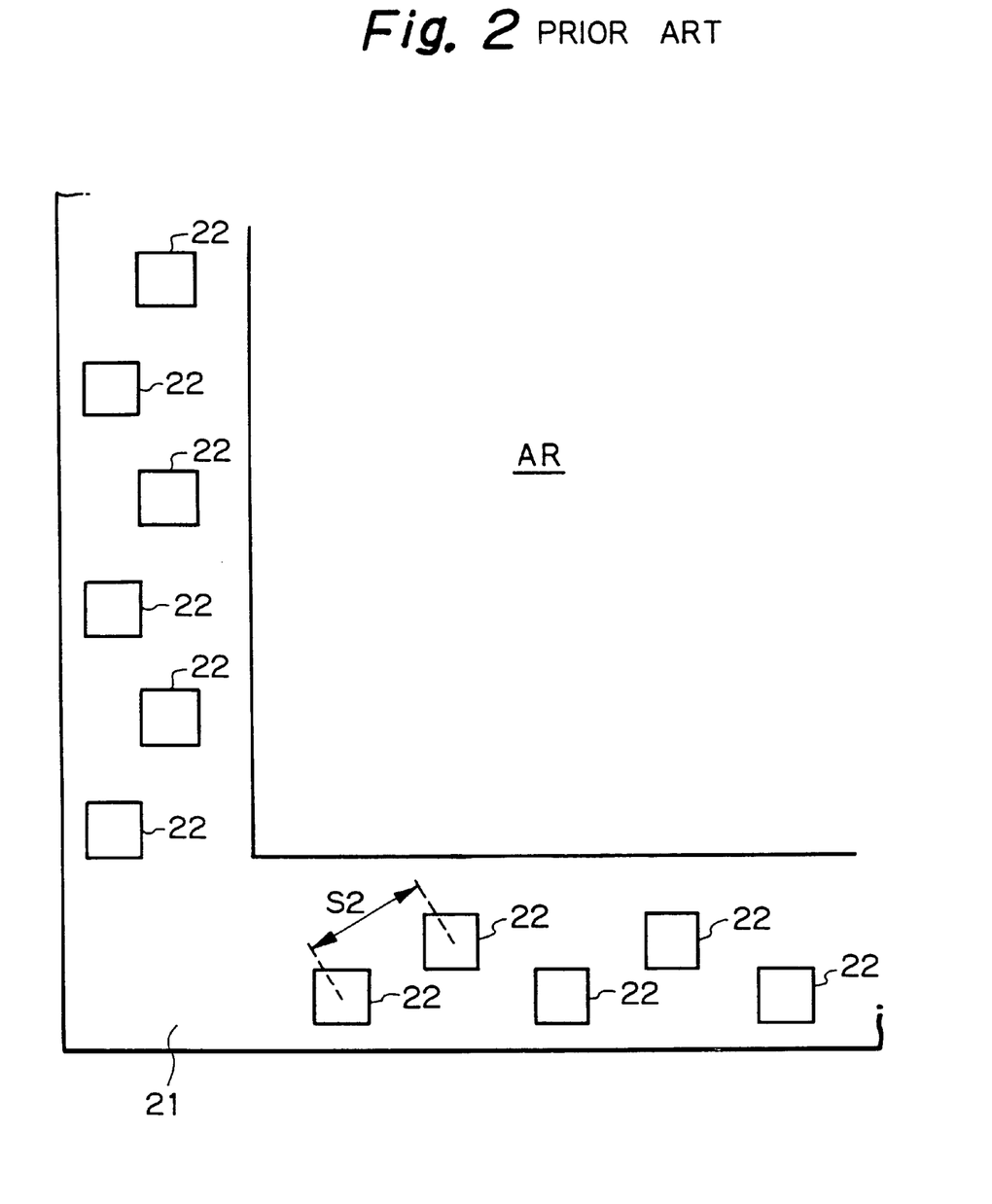
FIG. 2 is a plan view illustrating a COG specific chip.

In FIG. 2, which illustrates a prior art COG specific chip, a semiconductor chip 21 also includes a plurality of pads 22 along the periphery of the active area AR. Since the semiconductor chip 21 is mounted directly on a glass substrate of a liquid crystal display unit, the pads 22 are not always required to be arranged in a linear arrangement. Therefore, it is possible to locate the pads 22 in a staggered (zigzagged) arrangement as illustrated in FIG. 2. In this case, a spacing S2 between the pads 22 is about 150 μm in consideration of the mounting restriction.

Figure 3:
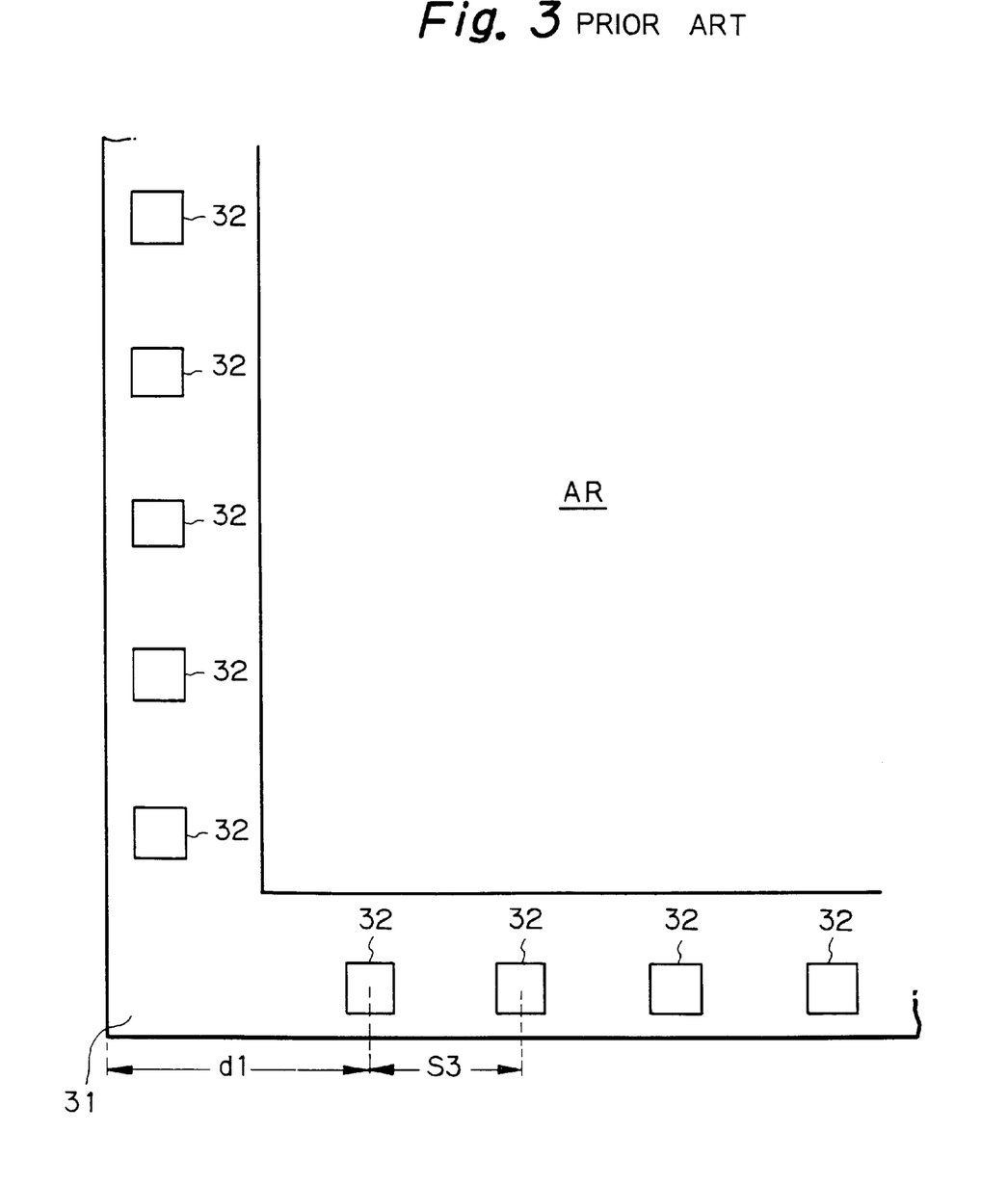
FIG. 3 is a plan view illustrating a TCP/COC, common chip.

In FIG. 3, which illustrates a prior art TCP/COG common chip, a semiconductor chip 31 includes a plurality of pads 32 located in a linear arrangement. Since the semiconductor chip 31 can be used as a COG chip, a spacing S3 between the pads 32 has to coincide with the spacing S2 of the pads 22 of the COG specific chip 21. That is, S3=S2. Therefore, the semiconductor chip 31 is increased in size, thus deteriorating the integration.

Figure 4:
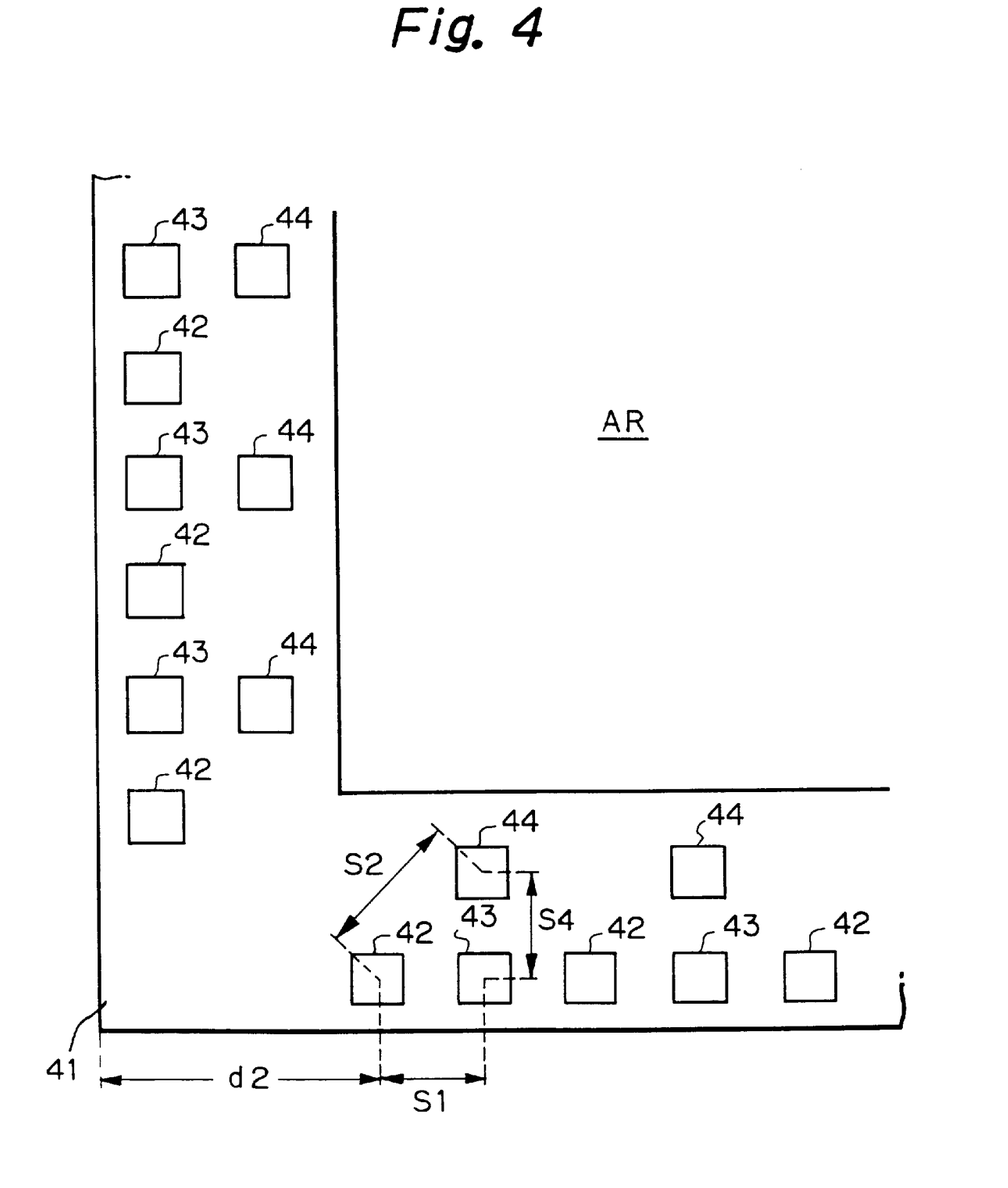
FIG. 4 is a plan view illustrating a first embodiment of the semiconductor device according to the present invention.

In FIG. 4, which illustrates a first embodiment of the present invention, a semiconductor chip 41 is used commonly for a TCP package and a COG package. The semiconductor chip 41 includes TCP/COG common pads 42, TCP specific pads 43 and COG specific pads 44. The TCP/COG common pads 42 and the TCP specific pads 43 are alternately arranged in one row, and the COG specific pads 44 are arranged in another row. In this case, a spacing between the pads 42 and 43 in the same as the spacing S1 of the pads 12 of the TCP specific chip 11 of FIG. 1, and a spacing between the pads 42 and 44 is the same as the spacing S2 of the pads 22 of the COG specific chip 21 of FIG. 2. Also, a spacing S4 between the row of the pads 42 and 43 and the row of the pads 44 is about 133 μm, for example.

Figure 5:
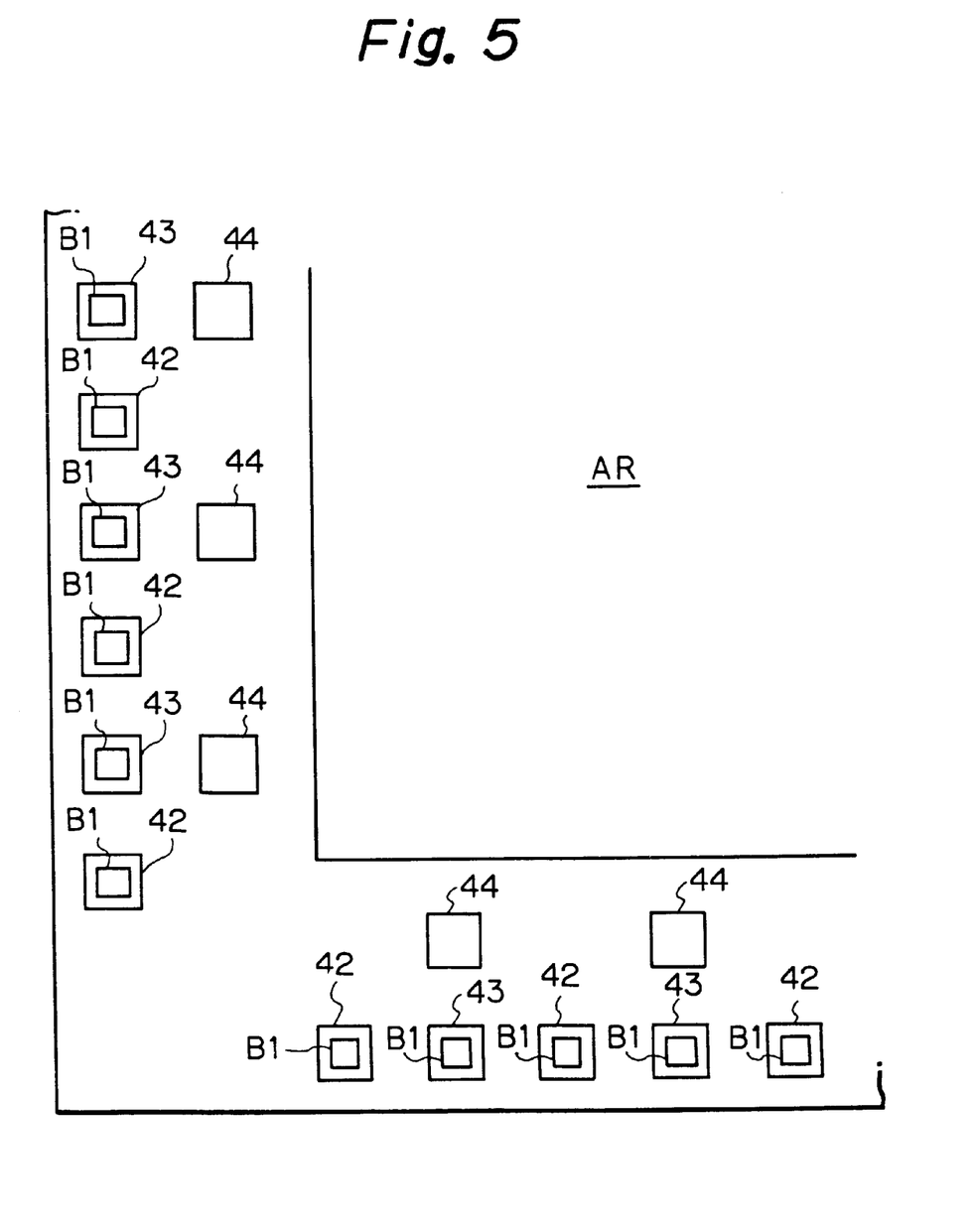
FIG. 5 is a plan view of the device of FIG. 4 when uses as a TCP chip.

As illustrated in FIG. 5, when the semiconductor chip 41 of FIG. 4 is used as a TCP chip, bumps B1 are formed on the TCP/COG common pads 42 and the TCP specific pads 43, while no bumps are formed on the COG specific pads 44. As a result, the bumps B1 are located in a linear arrangement, thus being mounted on a TCP tape.

Figure 6:
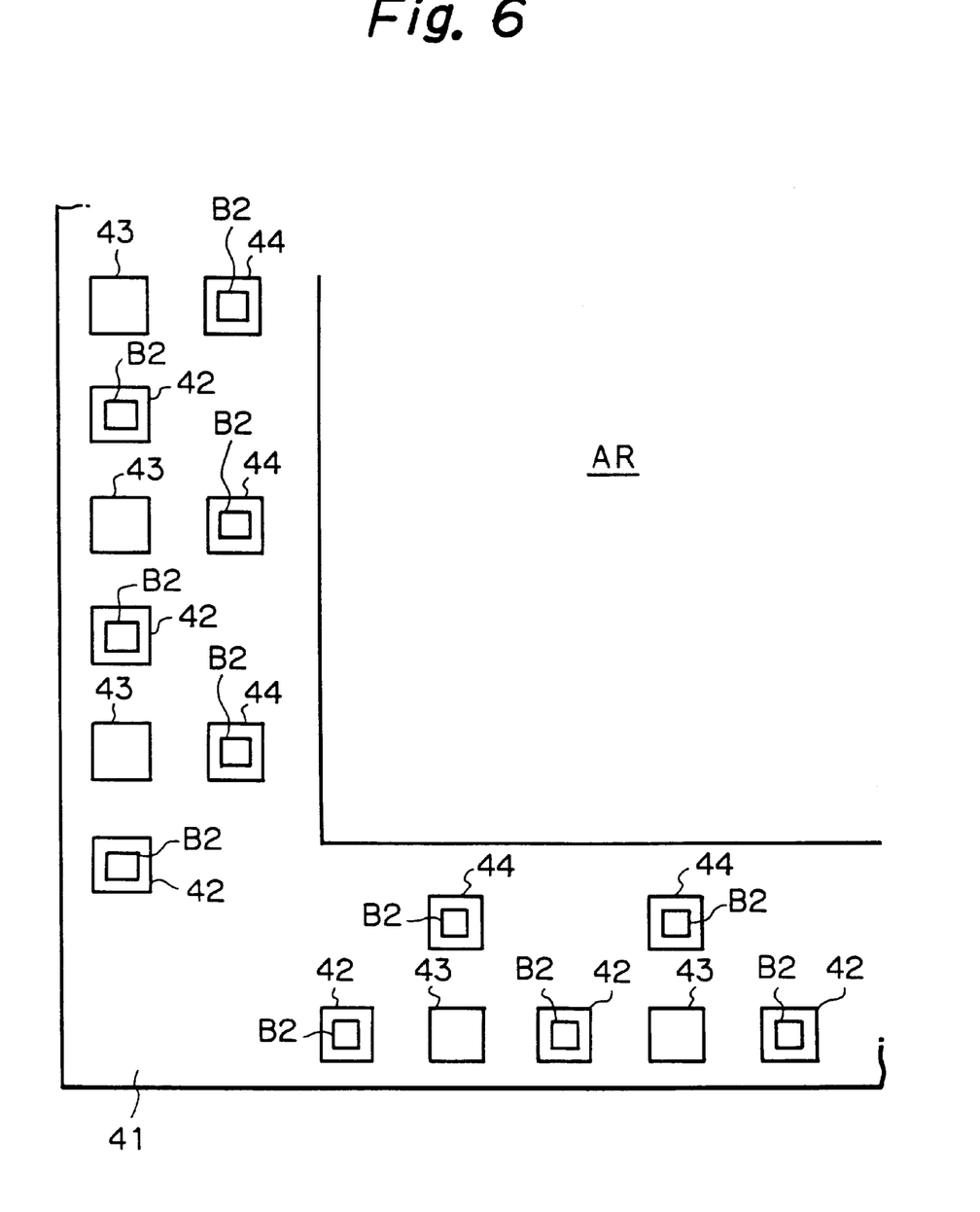
FIG. 6 is a plan view of the device of FIG. 4 when used as a COG chip.

As illustrated in FIG. 6, when the semiconductor chip 41 of FIG. 4 is used as a COG chip, bumps B2 are formed on the TCP/COG common pads 42 and the COG specific pads 44, while no bumps are formed on the TCP pads 43. As a result, the bumps B2 are located in a staggered arrangement, thus being able to be mounted on a COG.

Figure 7:
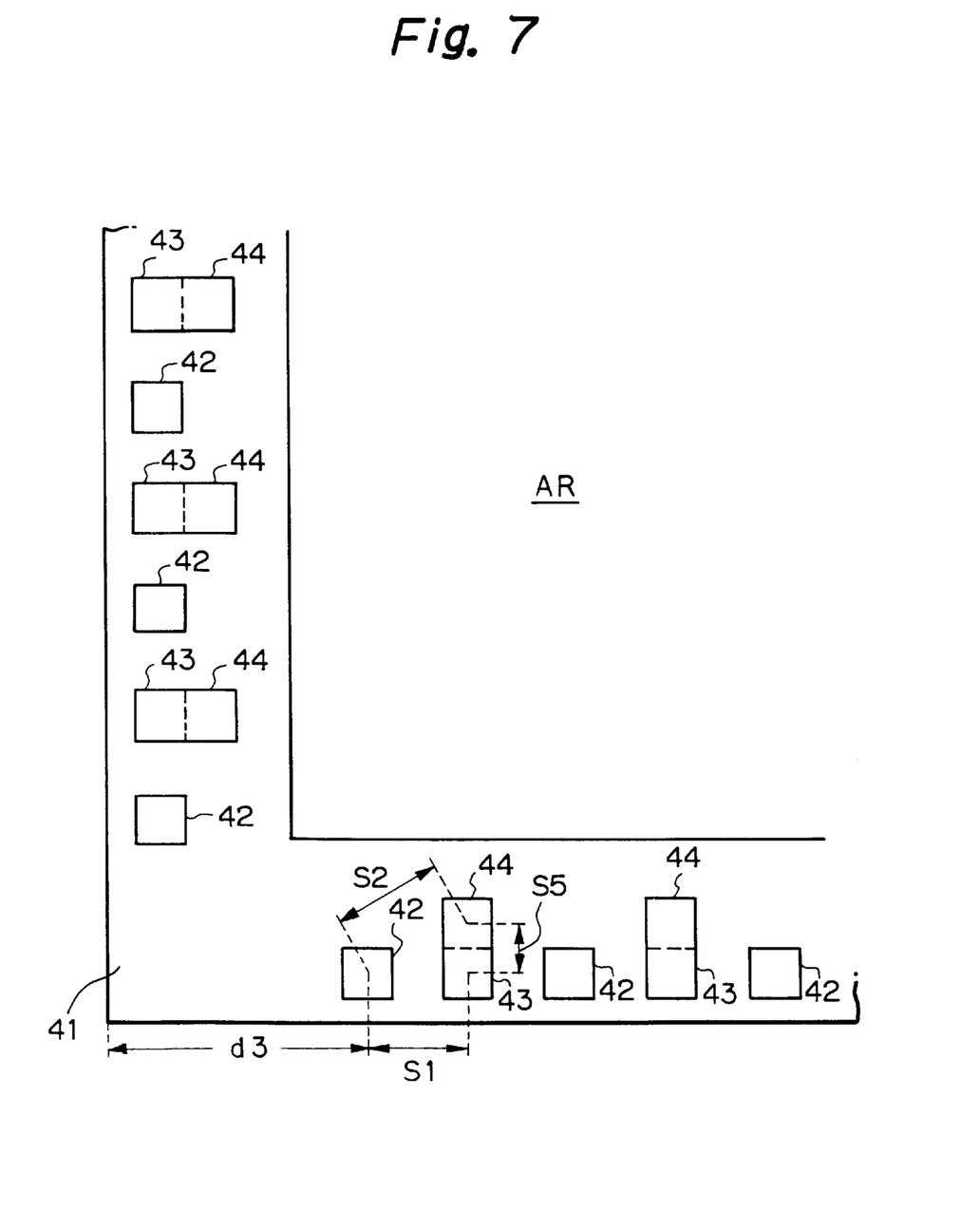
FIG. 7 is a plan view illustrating a second embodiment of the semiconductor device according to the present invention.

In FIG. 7, which illustrates a second embodiment of the present invention, the pads 43 are integral with respective ones of the pads 44. That is, a spacing S5 between the row of the pads 42 and 43 and the row of the pads 44 is about 65 μm, for example. Thus, the spacing S5 is reduced as compared with the spacing S4 of FIG. 4, thus further enhancing the integration.

Figure 8:
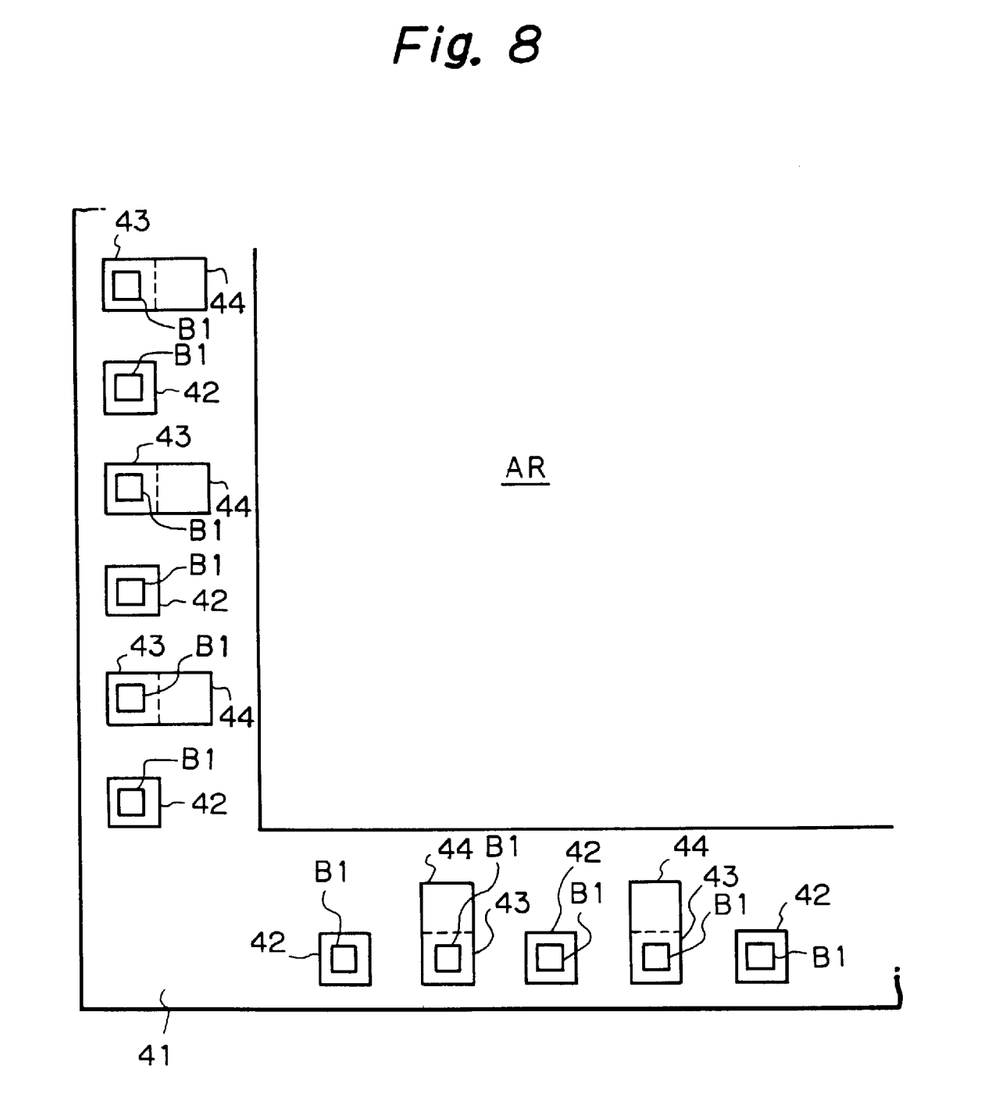
FIG. 8 a plan view of the device of FIG. 7 when used as a TCP chip.

As illustrated in FIG. 8, when the semiconductor chip 41 of FIG. 7 is used as a TCP chip, bumps B1 are formed on the TCP/COG common pads 42 and the TCP specific pads 43, while no bumps are formed on the COG specific pads 44. As a result, the bumps B1 are located in a linear arrangement, thus being able to be mounted on a TCP tape.

Figure 9:
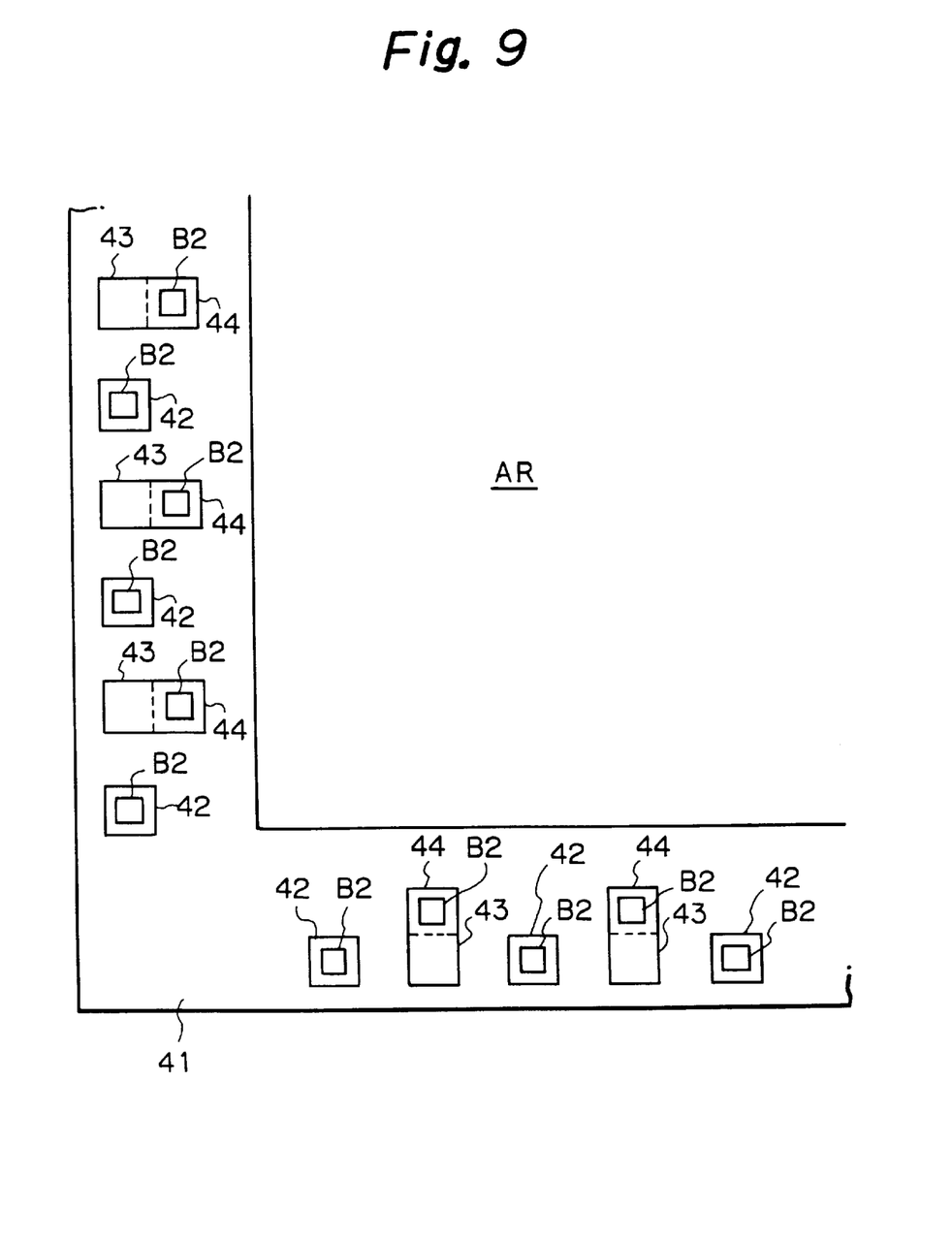
FIG. 9 is a plan view of the device of FIG. 7 when used as a COG chip.

As illustrated in FIG. 9, when the semiconductor chip 41 of FIG. 7 is used as a COG chip, bumps B2 are formed on the TCP/COG common pads 42 and the COG specific pads 44, while no bumps are formed on the TCP pads 43. As a result, the bumps B2 are located in a staggered arrangement, thus being able to be mounted on a COG.

Note that the pads 42, 43 and 44 of FIGS. 4 and 7 are also located in the periphery of the active area AR of the semiconductor chip 41.

In FIG. 3, assume that the number of the pads 32 per side is 25, and therefore, the total number of the pads 32 is 100, the spacing S3 (=S2)=150 μm, and a distance d1 between the center of the outermost one of the pads 32 and the edge of the chip 31 is 200 μm. In this case, a length of each side=150 μm×(25−1)+200 μm×2=4.00 mm Therefore, an area A1 of the semiconductor chip 31 of FIG. 3 is $$A1 = 16.0 \text{ mm}^2 \quad (1)$$

Also, in FIG. 4, the spacing S1=70 μm, and a distance d2 between the center of the outermost one of the pads 42 and the edge of the chip 41 is larger by S4, and accordingly, d2=200+133=333. In this case, a length of each side=70 μm×(25−1)+333 μm×2=2.35 mm Therefore, an area A2 of the semiconductor chip 41 of FIG. 4 is $$A2 = 5.5 \text{ mm}^2 \quad (2)$$

Further, FIG. 7, the spacing S1=70 μm, and a distance d3 between the center of the outermost one of the pads 42 and the edge of the chip 41 is larger by 65 μm, and accordingly, d3=200+65=265. In this case, a length of each side=70 μm×(25−1)+265 μm×2=2.21 mm Therefore, an area A3 of the semiconductor chip 41 of FIG. 7 is $$A3 = 4.9 \text{ mm}^2 \quad (3)$$

Thus, the area A2 (A3) of the semiconductor chip 41 of FIG. 4 (7) can be reduced to about one-third the area A1 of the semiconductor chip 31 of FIG. 3.

As explained hereinbefore, according to the present invention, the area of a TCP/COG common chip can be reduced, thus enhancing the integration.

I claim:

1. A semiconductor device comprising:
   a semiconductor chip having an active area surrounded at least in part by a peripheral area;
   a plurality of first pads and a plurality of second pads arranged in a first row at the peripheral area of said active area on said semiconductor chip, wherein said first pads alternate with said second pads;
   a plurality of third pads arranged in a second row in the peripheral area of said active area on said semiconductor chip, one of said second pads and one of said third pads being capable of receiving a signal, a spacing between one of said first pads and a respective one of said second pads being smaller than a spacing between one of said first pads and a respective one of said third pads; and
   bumps formed on each of said first and second pads while no bumps are formed on said third pads.

2. The device as set forth in claim 1, wherein one of said second pads is integral with one of said third pads.

3. A semiconductor device comprising:
   a semiconductor chip having an active area surrounded at least in part by a peripheral area;
   a plurality of first pads and a plurality of second pads arranged in a first row in the peripheral area of said active area on said semiconductor chip, wherein said first pads alternate with said second pads;
   a plurality of third pads arranged in a second row in the peripheral area of said active area on said semiconductor chip, one of said second pads and one of said third pads being capable of receiving a signal, a spacing between one of said first pads and a respective one of said second pads being smaller than a spacing between one of said first pads and a respective one of said third pads; and bumps formed on each of said first and third pads while no bumps are formed on said second pads.

4. The device as set forth in claim 3, wherein said first pads alternate with said second pads.

5. The device as set forth in claim 3, wherein one of said second pads is integral with one of said third pads.

6. A semiconductor device comprising:
   TCP/COG common pads;
   TCP specific pads; and
   COG specific pads;
   said TCP/COG common pads and said TCP specific pads being arranged in one row, with said TCP/COG common pads alternating with said TCP specific pads, said COG specific pads being arranged in another row;
   a spacing between one of said TCP/COG pads and a respective one of said TCP pads being smaller than a spacing between one of said TCP/COG pads and a respective one of said COG pads.

7. The device as set forth in claim 6, further comprising bumps formed on said TCP/COG common pads and said TCP specific pads, while no bumps are formed on said COG pads.

8. The device as set forth in claim 6, further comprising bumps formed on said TCP/COG common pads and said COG specific pads, while no bumps are formed on said TCP pads.

9. The device as set forth in claim 6, wherein said TCP specific pads are integral with said COG specific pads.

10. A semiconductor device comprising:
    a semiconductor chip;
    a first group of pads and a second group of pads arranged in a first row on said semiconductor chip, with said first group of pads alternating with said second group of pads;
    a third group of pads arranged in a second row on said semiconductor chip; and bumps formed on said first group of pads and on only one group of said second and third groups of pads, and one pad of said second group of pads and one pad of said third group of pads being capable of receiving one signal, a spacing between one of said first group of pads and a respective one of said second group of pads being smaller than a spacing between one of said first group of pads and a respective one of said third group of pads.

11. The device set forth in claim 10, wherein one pad of said second group of pads in integral with one pad of said third group of pads.

12. The device as set forth in claim 10, wherein said first second and third groups of pads are arranged at a periphery of an active area of said semiconductor chip.

* * * * *